(12) United States Patent
Wang et al.

(10) Patent No.: US 6,721,939 B2
(45) Date of Patent: Apr. 13, 2004

(54) ELECTRON BEAM SHOT LINEARITY MONITORING

(75) Inventors: Wen-Chuan Wang, Taipei (TW); Tyng-Hao Hsu, Hsinchu (TW); Chin-Hsiang Lin, Kaohsiung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 91 days.

(21) Appl. No.: 10/080,323

(22) Filed: Feb. 19, 2002

(65) Prior Publication Data

US 2003/0159125 A1 Aug. 21, 2003

(51) Int. Cl.$^7$ .................. G06F 17/50; G06F 19/00; G21K 5/04
(52) U.S. Cl. .................. 716/21; 700/109; 700/120; 700/121; 430/5; 378/35; 382/144; 382/154; 702/83; 702/86; 702/159; 702/172
(58) Field of Search .................. 716/21; 700/109, 700/120, 121; 430/5; 378/35; 382/144, 154; 702/83, 86, 159, 172

(56) References Cited

U.S. PATENT DOCUMENTS 5,586,059 A * 12/1996 Oshelski et al. .............. 702/84
5,851,702 A * 12/1998 Watanabe et al. .............. 430/5

(List continued on next page.)

FOREIGN PATENT DOCUMENTS

JP  03185807 A * 8/1991 ......... H01L/21/027

OTHER PUBLICATIONS

Arimoto et al., "Monitoring of SRAM gate patterns in KrF lithography by ellipsometry", Proceedings of the 1998 International Conference on Microelectronics Test Structures, Mar. 23, 1998, pp. 51–55.*

McGahan et al., "Design and performance of a normal–incidence optical critical dimension metrology system", International Microprocesses and Nanotechnology Conference, Oct. 31, 2001, p. 238.*

Wagner et al., "Interprocess run–to–run feedforward control for wafer patterning", Proceedings of the 1999 IEEE International Conference on Control Applications, Aug. 22, 1999, vol. 1, pp. 789–795.*

Ng et al., "The advent of CD–SEM technologies for metrology on advanced photomasks", Microprocesses and Nanotechnology Conference, Jul. 6, 1999, p. 186.*

*Primary Examiner*—Matthew Smith
*Assistant Examiner*—Phallaka Kik
(74) *Attorney, Agent, or Firm*—Tung & Associates (57) ABSTRACT

Electron beam (e-beam) shot linearity monitoring is disclosed. A pattern is written that has a predetermined size and a predetermined form in a predetermined position on a substrate, such as a semiconductor wafer, a reticle, or a photomask. The pattern writing fixes the e-beam shot size, as located along one or more critical dimensions of the pattern. The critical dimensions are then measured, where their variations reflect the e-beam shot size linearity. Thereafter, deficiencies in the e-beam shot size linearity can be compensated for, to allow for properly produced semiconductor patterns.

20 Claims, 10 Drawing Sheets

U.S. PATENT DOCUMENTS

| | | | |
|---|---|---|---|
| 5,965,306 A | * 10/1999 | Mansfield et al. | 430/22 |
| 6,178,360 B1 | * 1/2001 | Pierrat et al. | 700/121 |
| 6,274,876 B1 | * 8/2001 | Kawanami et al. | 250/492.22 |
| 6,334,209 B1 | * 12/2001 | Hashimoto et al. | 716/21 |
| 6,519,501 B2 | * 2/2003 | Pierrat et al. | 700/121 |
| 6,557,163 B1 | * 4/2003 | Rankin et al. | 716/21 |
| 6,562,549 B2 | * 5/2003 | Zemen et al. | 430/316 |
| 6,566,016 B1 | * 5/2003 | Ziger | 430/5 |
| 6,567,972 B1 | * 5/2003 | Tanaka et al. | 716/21 |
| 6,579,650 B2 | * 6/2003 | Mono et al. | 430/5 |
| 6,610,989 B1 | * 8/2003 | Takahashi | 250/492.3 |
| 6,633,831 B2 | * 10/2003 | Nikoonahad et al. | 702/155 |
| 2001/0029403 A1 | * 10/2001 | Pierrat et al. | 700/121 |
| 2002/0012861 A1 | * 1/2002 | Luhn et al. | 430/30 |
| 2002/0021433 A1 | * 2/2002 | Okita et al. | 355/55 |
| 2002/0100013 A1 | * 7/2002 | Miwa et al. | 716/21 |
| 2002/0115020 A1 | * 8/2002 | Yang | 430/296 |
| 2002/0164064 A1 | * 11/2002 | Karklin et al. | 382/145 |
| 2002/0188417 A1 | * 12/2002 | Levy et al. | 702/155 |
| 2003/0128350 A1 | * 7/2003 | Tanaka | 355/72 |
| 2003/0170552 A1 | * 9/2003 | Miyashita et al. | 430/30 |

* cited by examiner

FIG 1A

PRIOR ART

FIG 1B

PRIOR ART

FIG 2A

PRIOR ART

FIG 2B

PRIOR ART

ELECTRON BEAM SHOT LINEARITY MONITORING

FIELD OF THE INVENTION

This invention relates generally to photolithography for semiconductor processing, and more particularly to electron beam (e-beam) aligners used in such photolithography.

BACKGROUND OF THE INVENTION

Figure 1A:
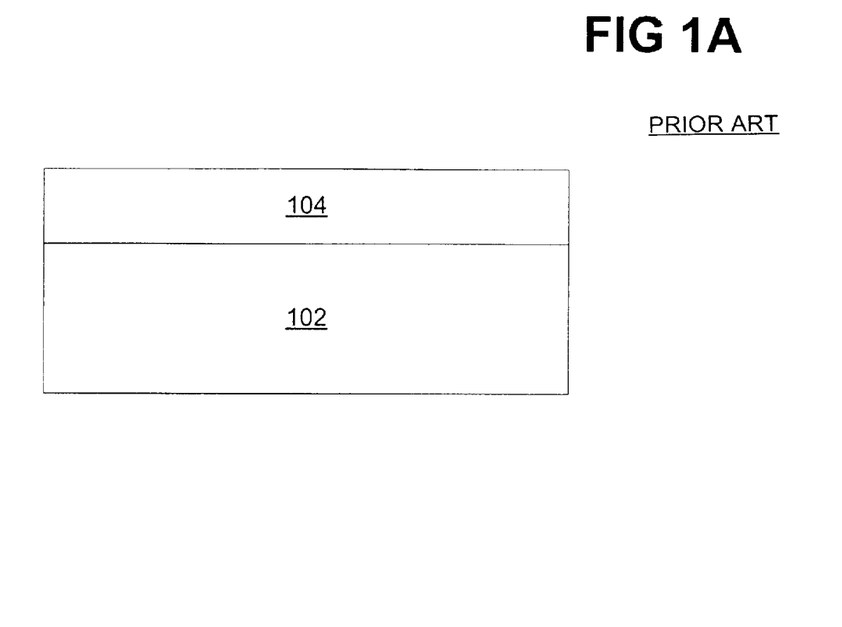
FIGS. 1A and 1B are diagrams showing the effect of patterning on a layer deposited on a semiconductor wafer.
Figure 1B:
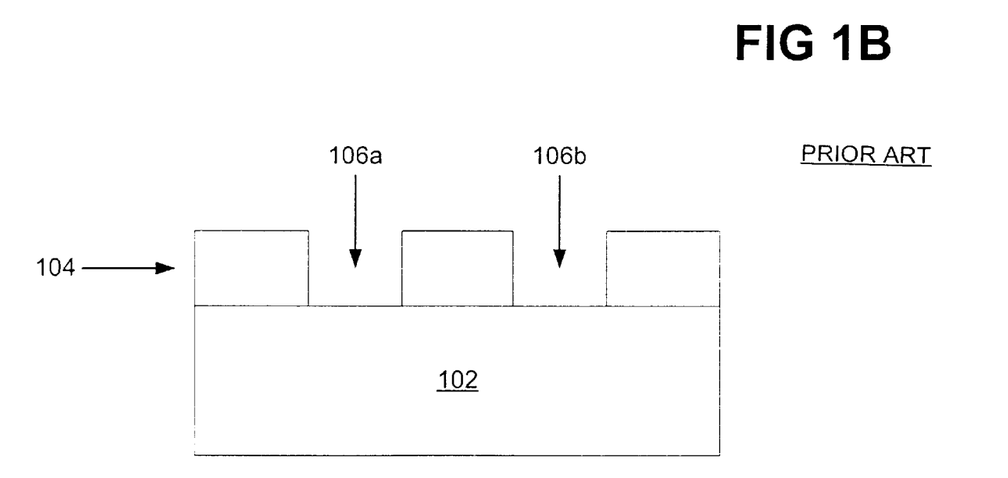

Patterning is one of the basic steps performed in semiconductor processing. It also referred to as photolithography, masking, oxide or metal removal, and microlithography. Patterning enables the selective removal of material deposited on a semiconductor substrate, or wafer, as a result of a deposition process. For example, as shown in FIG. 1A, a layer 104 has been deposited on a substrate 102. After the photolithography process is performed, as shown in FIG. 1B, some parts of the layer 104 have been selectively removed, such that gaps 106a and 106b are present within the layer 104. A photomask, or pattern, is used (not shown in FIG. 1B) so that only the material from the gaps 106a and 106b are removed, and not the other portions of the layer 104.

The process of adding layers and removing selective parts of them, in conjunction with other processes, permits the fabrication of semiconductor devices. Alignment is critical in photolithography and deposition, as well as in other semiconductor processes. If layers are not deposited properly, or if they are not selectively removed properly, the resulting semiconductor devices may not function, relegating them to scrap, which can be costly.

One type of aligner that can be used in photolithography is the electron beam, or e-beam aligner. Electron beam lithography is used in the production of high-quality masks and reticles, as well as in the direct patterning of wafers. An e-beam system includes an electron source that produces a small diameter spot, or shot, and a blanker capable of turning the beam on and off. The exposure takes place in a vacuum to prevent air molecules from interfering with the electron beam. The beam passes through electrostatic plates capable of directing, or steering, the beam in the x and y directions on the mask, reticle, or wafer. Precise direction of the beam usually requires that the beam travel in a vacuum chamber in which there is the electron beam source, support mechanisms, and the substrate being exposed.

Since the desired pattern is generated by a computer, there typically is no mask in e-beam lithography. The beam is directed to specific positions on the wafer surface by a deflection subsystem, and the beam turned on where the resist is to be exposed. Larger substrates are mounted on an x-y stage and are moved under the beam to achieve full surface exposure. This alignment and exposure technique is referred to as direct writing.

Figure 2A:
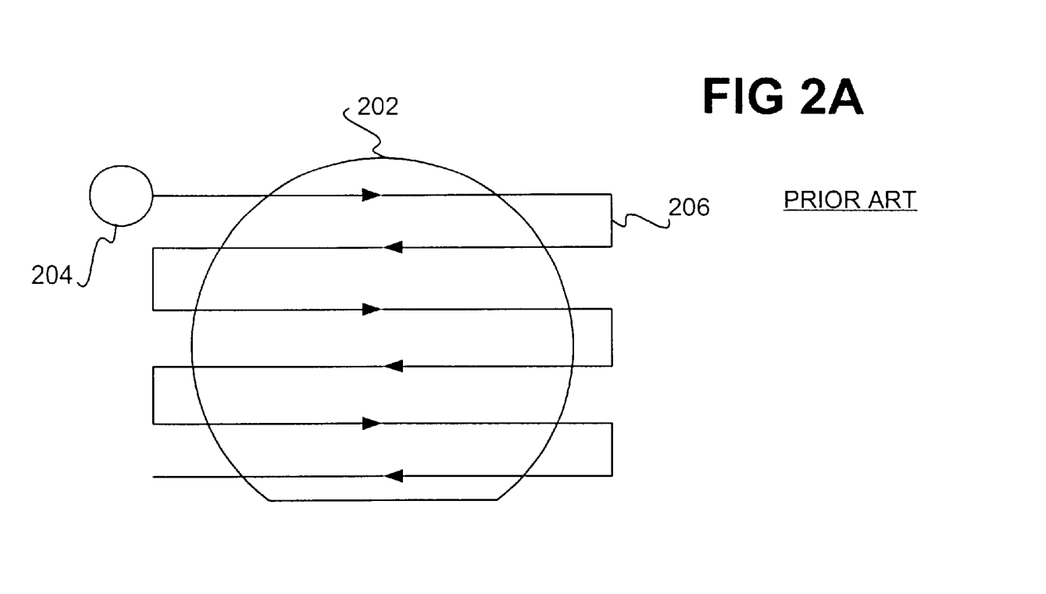
FIGS. 2A and 2B are diagrams showing electron beam (e-beam) raster scanning and vector scanning, respectively.
Figure 2B:
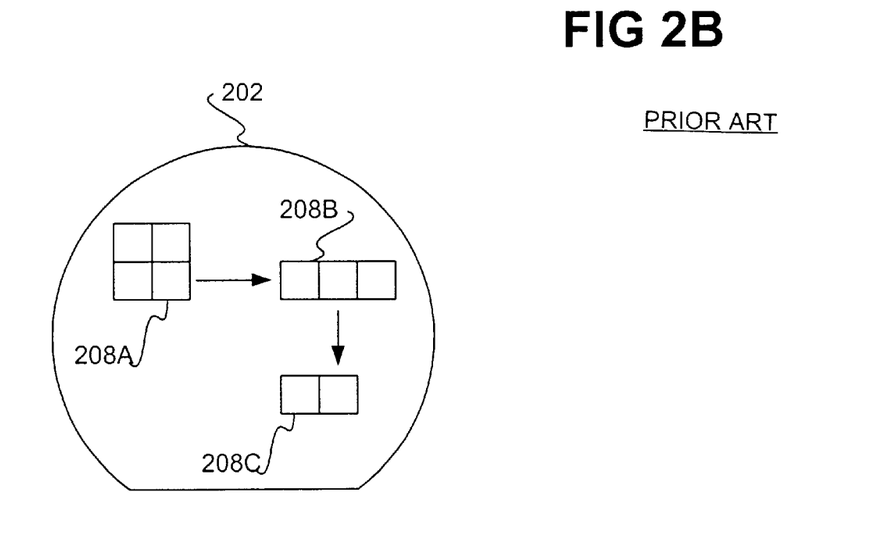

The pattern is exposed in the resist layer of the wafer by either raster or vector scanning, which are shown in FIGS. 2A and 2B, respectively. In FIG. 2A, the beam 204 is moved on the wafer 202 as indicated by the arrowed line 206, side-to-side and down the wafer 202. A computer directs the movement and activates the blanker in regions where the resist is to be exposed. A drawback to raster scanning is the time required for the beam to scan, since it travels over the entire surface of the wafer 202. By comparison, in FIG. 2A, the beam is moved on the wafer 202 directly to the regions that have to be exposed, such as from position 208A, to position 208B, and then to position 208C. At each position, small square- or rectangular-shaped areas are exposed, building up the desired shape of the exposed area.

Furthermore, since the invention of the integrated circuit (IC), semiconductor chip features that are patterned using photolithography techniques such as e-beam lithography have become exponentially smaller and the number of transistors per device exponentially larger. Advanced IC's with hundreds of millions of transistors at feature sizes of 0.25 micron, 0.18 micron, 0.13 micron, and less are becoming routine. To continue to make chip features smaller, and increase the transistor density of semiconductor devices, IC's have begun to be manufactured that have features smaller than the lithographic wavelength.

Sub-wavelength lithography, however, places large burdens on lithographic processes. Resolution of anything smaller than a wavelength is generally quite difficult. Pattern fidelity can deteriorate dramatically in sub-wavelength lithography. The resulting semiconductor features may deviate significantly in size and shape from the ideal pattern drawn by the circuit designer. These distortions include line-width variations dependent on pattern density, which affect a device's speed of operation, and line-end shortening, which can break connections to contacts. To avoid these and other proximity effects, the semiconductor industry has attempted to compensate for them in the photomasks themselves.

This compensation is generally referred to as optical proximity correction (OPC). The goal of OPC is to produce smaller features in an IC using a given equipment set by enhancing the printability of a wafer pattern. OPC applies systematic changes to mask geometries to compensate for the nonlinear distortions caused by optical diffraction and resist process effects. A mask incorporating OPC is thus a system that negates undesirable distortion effects during pattern transfer. OPC works by making small changes to the IC layout that anticipate the distortions. OPC offers basic corrections and a useful amount of device yield improvement, and enables significant savings by extending the lifetime of existing lithography equipment. Distortions that can be corrected by OPC include line-end shortening and corner rounding, among others.

For photomasks having features of 0.13 micron or smaller in particular, OPC is aggressively used to ensure that the features are properly printed on the wafer or mask. When such masks or wafers used with e-beam photolithography, this means that shots of extremely small sizes are unavoidable for proper e-beam exposure. Nearly all e-beam systems exhibit some proximity effects. Such small shots are necessary to achieve proper critical dimensioned features, where critical dimensions are the widths of the lines and spaces of critical circuit patterns and the areas of critical contacts.

A source of error that can affect critical dimension uniformity and mean values is poor e-beam shot linearity. E-beam shot linearity is the degree to which the relative sizes of e-beam shots, or spots, deviate from their intended size. Like other errors that occur in semiconductor fabrication, poor e-beam shot linearity must be measured and monitored in order for it to be compensated and properly patterned semiconductor wafers to be subsequently produced. Unfortunately, however, deficiency in e-beam shot size linearity is generally measured or monitored only with difficulty. Linearity deficiency is more specifically difficult to be isolated from other error sources. This inability to measure the lack of e-beam linearity means that linearity deficiencies cannot subsequently be easily corrected or compensated for, resulting in improperly patterned semiconductor wafers.

Therefore, there is a need to accurately monitor e-beam shot size linearity deficiency. Such monitoring should desirably be able to isolate such linearity deficiency from other sources of errors. Furthermore, such monitoring should desirably enable subsequent correction or compensation for the linearity deficiency, resulting in more properly patterned semiconductor wafers. For these and other reasons, there is a need for the present invention.

SUMMARY OF THE INVENTION

The invention relates to monitoring electron beam (e-beam) shot linearity. A pattern is written that has a predetermined size and a predetermined form in a predetermined position on a substrate, such as a semiconductor wafer or a reticle (i.e. a photomask). The pattern writing fixes the e-beam shot size, as located along one or more critical dimensions of the pattern. The critical dimensions are then measured, where their variations reflect the e-beam shot size linearity. Thereafter, deficiencies in the e-beam shot size linearity can be compensated for, to allow for properly produced semiconductor patterns.

The invention provides for advantages over the prior art. By using the invention, e-beam capability as to shot size control can be determined. The error caused by e-beam shot size instability may be defined, and shot size stability may be subsequently optimized. An optimal shot range for critical dimension uniformity control can be defined, and more suitable optical proximity correction (OPC) rules may be defined that avoid too small features. Furthermore, the shot size linearity data that is measured can be used to modify the e-beam dissection mode to avoid shot sizes having poor linearity. Still other advantages, embodiments, and aspects of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 3:
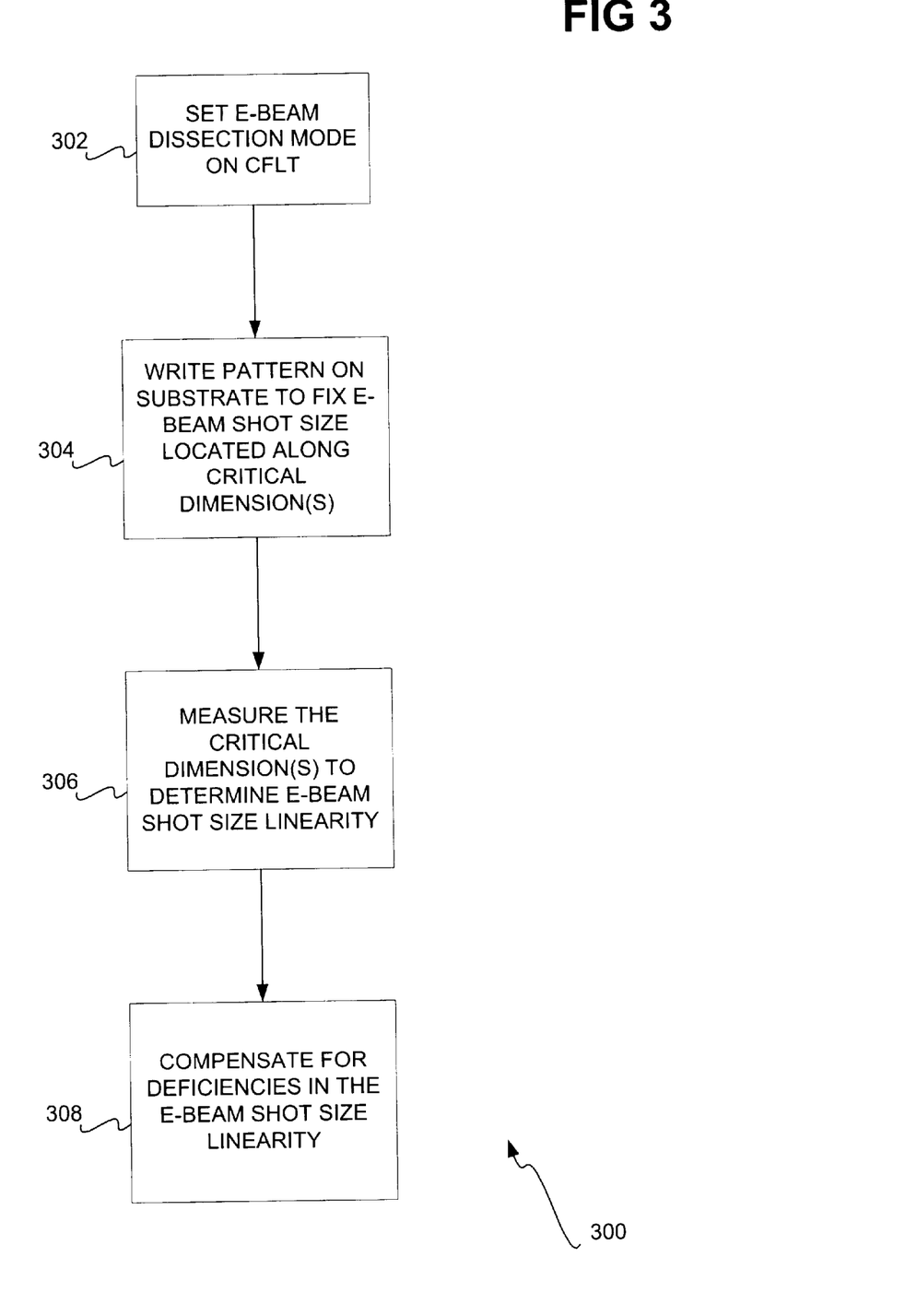
FIG. 3 is a flowchart of a method according to an embodiment of the invention.

FIG. 3 shows a method 300 according to which an embodiment of the invention monitors electron beam (e-beam) shot size linearity, and compensates for deficiencies in such linearity. The method 300 can be used in accordance with e-beam lithography, for producing semiconductor devices. For example, an e-beam lithography system may have a computer having a processor, or may have a processor itself, that executes instructions stored on a computer-readable medium to perform the method 300. As another example, a semiconductor device may be formed at least in part by e-beam lithography using an e-beam system, where the e-beam system has had shot size linearity deficiencies corrected per the method 300.

First, the e-beam dissection mode is preferably set to cflt, which is also referred to cflat, as known within the art (302). Dissection can generally refer to how the electron beam is diffused, steered, and/or focused from the source of the electron beams to the substrate on which it is subjected. The substrate itself may be a reticle, a photomask, or a semiconductor wafer. Next, a pattern is written using the e-beam system (304). The pattern has a predetermined size and a predetermined form in a predetermined position on the substrate. This fixes the e-beam shot size as located along one or more critical dimensions of the pattern.

Figure 4A:
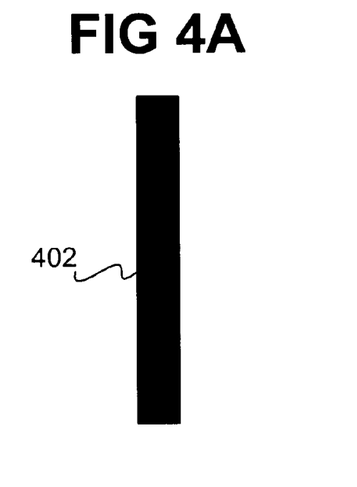
FIGS. 4A, 4B, 4C, and 4D are diagrams of the basic patterns used by an embodiment of the invention.
Figure 4B:
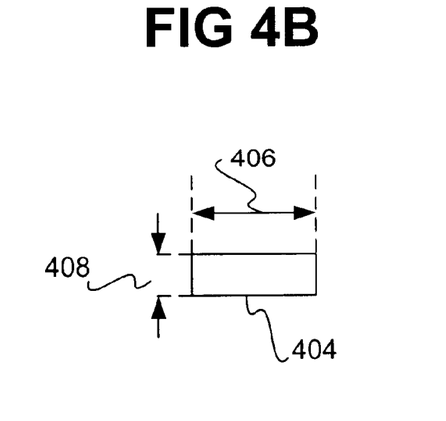
Figure 4C:
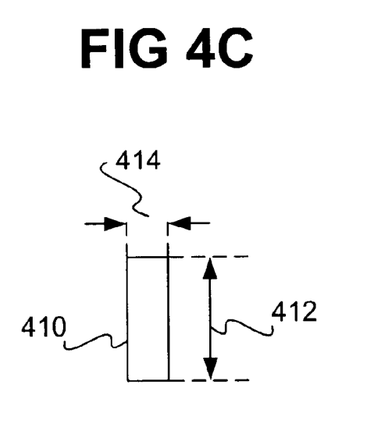
Figure 4D:
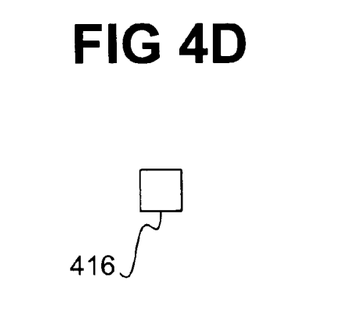

FIGS. 4A, 4B, 4C, and 4D show the preferred four basic patterns that can be used to construct the pattern written in 304. In FIG. 4A, a critical dimension 402 is shown, which is a dark line, indicating an unexposed area. In FIG. 4B, an e-beam shot, or spot, 404 is shown, having a fixed width 406 and a variable height 408. The fixed width 406 may be 1.5 microns, whereas the variable height 408 may be between 0.01 and 1.5 microns. In FIG. 4C, an e-beam shot 410 is shown, having a fixed height 412 and a variable width 414. The fixed height 412 may be 1.5 microns, whereas the variable width 414 may be between 0.01 and 1.5 microns. In FIG. 4D, an e-beam unexposed area 416 is shown, which has a fixed shot size and shape, such as a rectangle or a square. The unexposed area 416 is generally a special pattern, being a small island of a given size. Whereas the basic pattern of FIG. 4A is an unexposed area, indicated as a dark region, the basic patterns of FIGS. 4B and 4C are exposed areas, indicated as clear regions. FIG. 4D is an unexposed area.

Figure 5A:
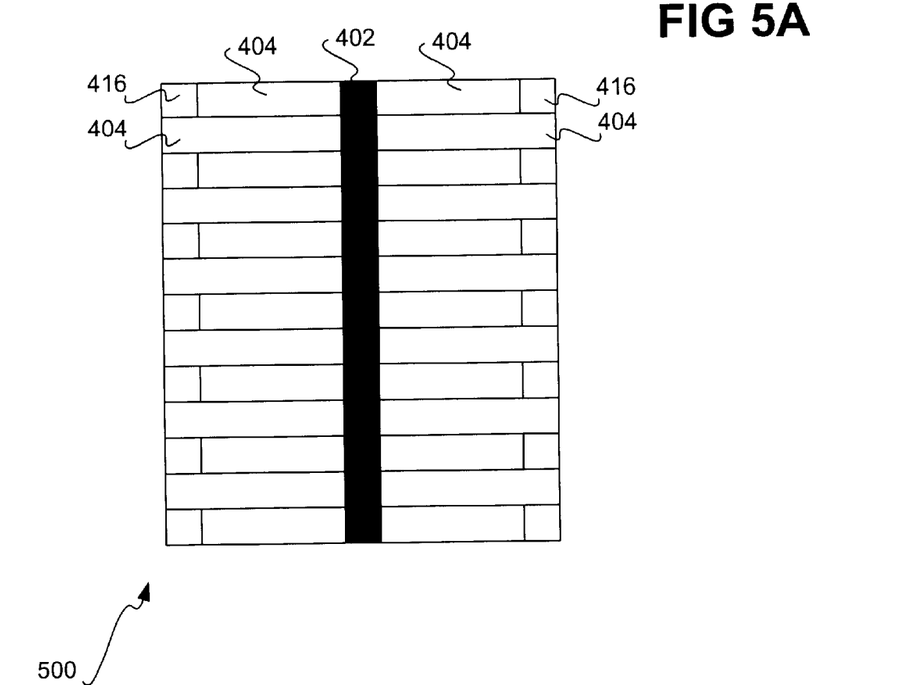
FIGS. 5A, 5B, 5C, and 5D are diagrams showing patterns made up of the basic patterns of FIGS. 4A, 4B, 4C, and 4D, as used by an embodiment of the invention.

FIGS. 5A, 5B, 5C, and 5D show four example patterns that may be written in 304 of FIG. 3 as constructed from the basic patterns of FIGS. 4A, 4B, 4C, and/or 4D. In FIG. 5A, the pattern 500 includes the critical dimension 402 vertically oriented. Series of row pairs made up of other of the basic patterns intersect orthogonally with the critical dimension 402. For instance, one row pair includes a first row having the unexposed area 416 followed by the shot 404 to the left of the critical dimension 402, and then the shot 404 followed by the unexposed area 416 to the right of the critical dimension 402. A second row of the row pair has the shot 404 both to the left and the right of the critical dimension 402.

Figure 5B:
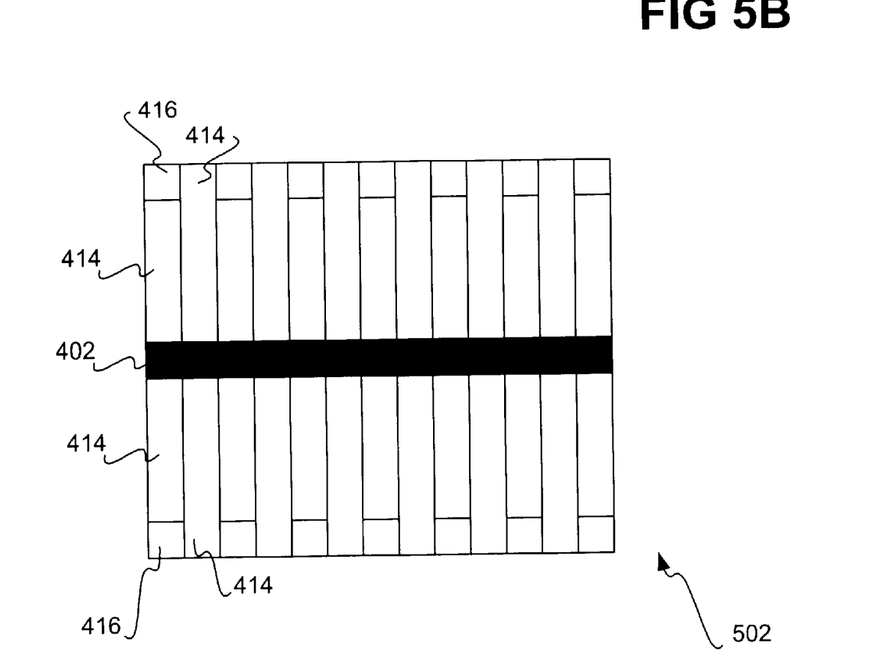

In FIG. 5B, the pattern 502 includes the critical dimension 402 horizontally oriented. Series of column pairs made up of other of the basic patterns intersect orthogonally with the critical dimension 402. For instance, one column pair includes a first column having the unexposed area 416 followed by the shot 414 above the critical dimension 402, and then the shot 414 followed by the unexposed area 416 below the critical dimension 402. A second column of the column pair has the shot 414 both above and below the critical dimension 402.

Figure 5C:
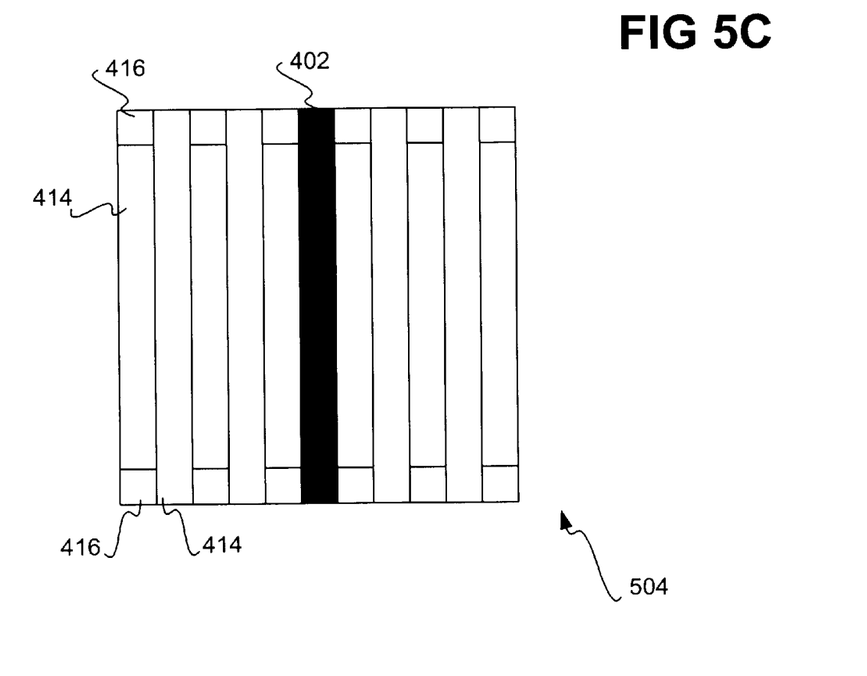

In FIG. 5C, the pattern 504 includes the critical dimension 402 vertically oriented. Series of column pairs made up of other of the basic patterns are vertically oriented parallel to the critical dimension 402. For instance, one column pair includes a first column having the unexposed area 416 followed by the shot 414 and then followed by the unexposed area 416. A second column of the column pair includes only the shot 414.

Figure 5D:
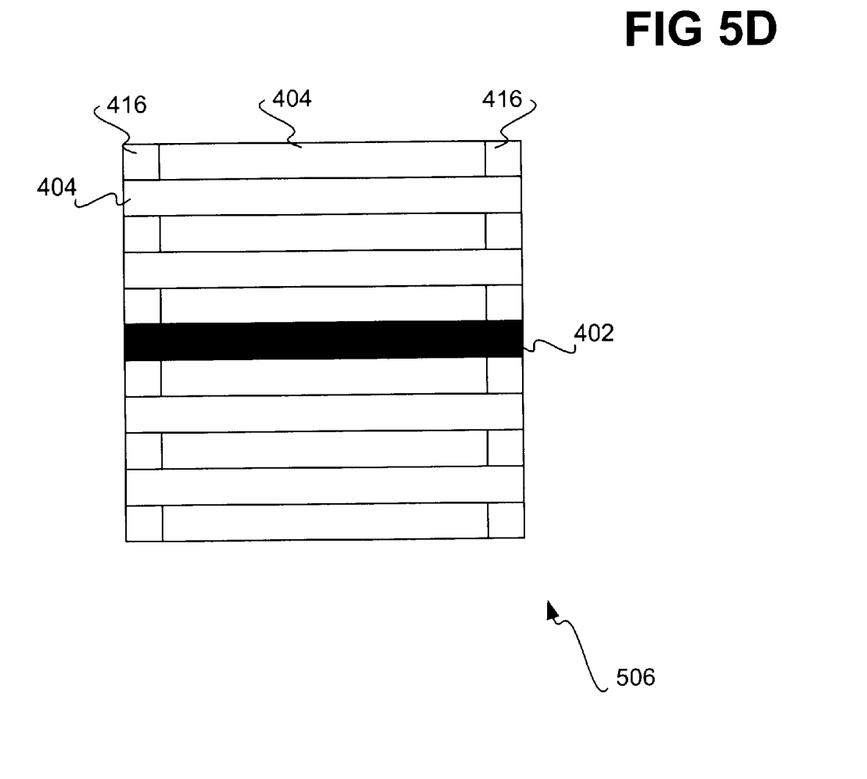

In FIG. 5D, the pattern 506 includes the critical dimension 402 horizontally oriented. Series of row pairs made up of other of the basic patterns are horizontally oriented parallel to the critical dimension 402. For instance, one row pair includes a first row having the unexposed area 416 followed by the shot 404 and then followed by the unexposed area 416. A second row of the row pair includes only the shot 404.

Figure 6A:
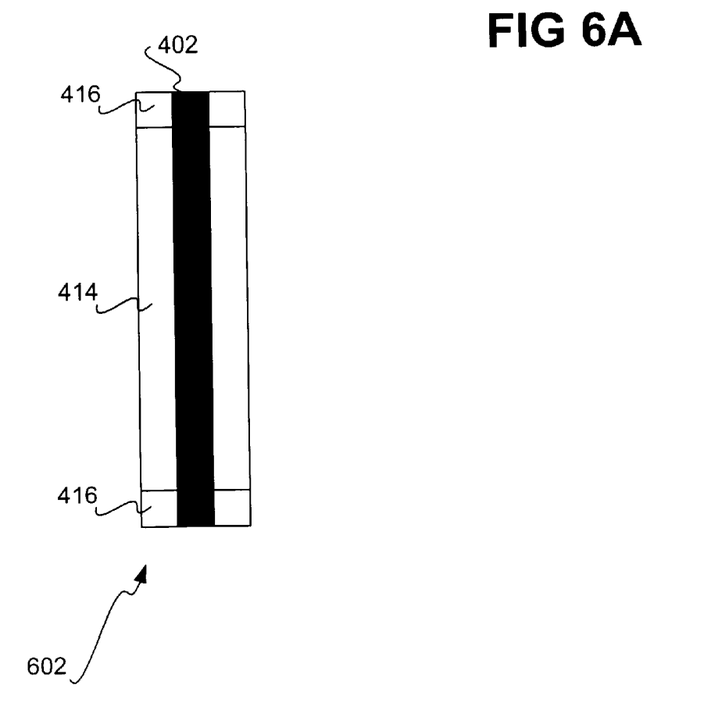
FIGS. 6A and 6B are diagrams showing optical proximity correction (OPC) patterns made up of the basic patterns of FIGS. 4A, 4B, 4C, and/or 4D, as used by an embodiment of the invention.
Figure 6B:
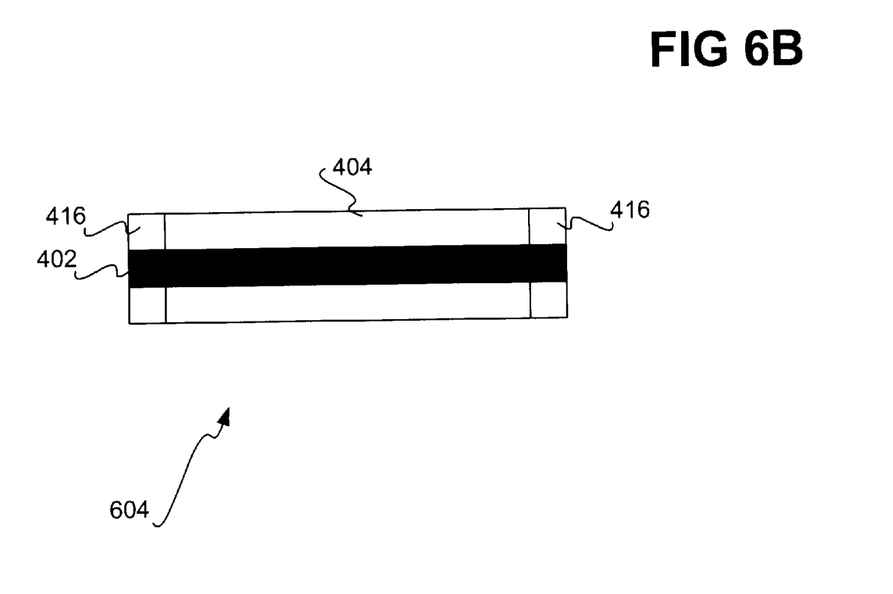

The pattern written in 304 of FIG. 3 may also include an optical proximity correction (OPC) pattern. FIGS. 6A and 6B show two examples of such OPC patterns. In FIG. 6A, the OPC pattern 602 is made using the basic patterns of FIGS. 4A, 4B, 4C, and/or 4D. Specifically, the critical dimension 402 is vertically oriented, and there is one column parallel and adjacent to the critical dimension 402 on either side of the critical dimension 402. Each column includes the unexposed area 416, followed by the shot 414, and then followed by the unexposed area 416 again.

In FIG. 6B, the OPC pattern 604 is also made using the basic patterns of FIGS. 4A, 4B, 4C, and/or 4D. Specifically, the critical dimension 402 is horizontally oriented, and there is one row parallel and adjacent to the critical dimension 402 both above and below the critical dimension 402. Each row includes the unexposed area 416, followed by the shot 404, and then followed by the unexposed area 416 again.

Figure 7:
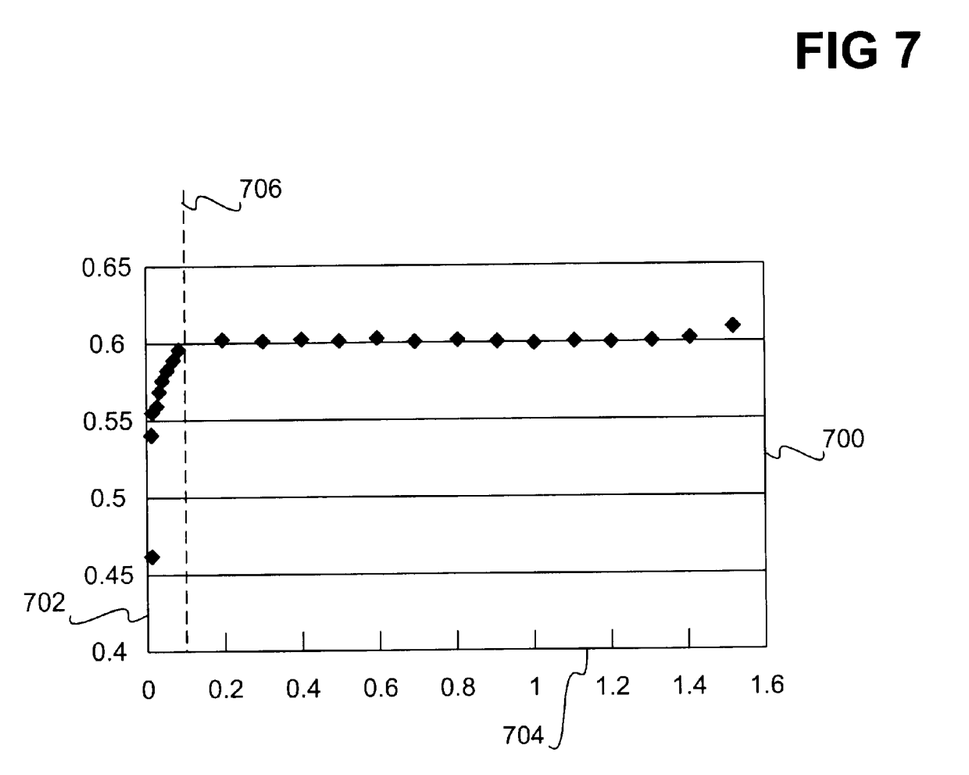
FIG. 7 is a diagram of an example graph showing when e-beam shot size linearity deficiency results for the patterns of FIGS. 5A, 5B, 5C, and/or 5D, according to an embodiment of the invention.

Referring back to FIG. 3, the critical dimension(s) are measured after the pattern has been written (306), either indirectly or directly. This allows the linearity of the e-beam shot size to be determined, where variations in the critical dimension(s) reflect the e-beam shot size linearity. Thus, the relationship of critical dimension versus shot size variation can be determined, an example of which is shown in FIG. 7. The graph 700 plots the critical dimension on the y-axis 702 in microns as a function of shot size on the x-axis 704 in microns, based on critical dimension measurements taken from one or more of the patterns of FIGS. 5A, 5B, 5C, 5D, 6A, and 6B. The critical dimension reflects strong linearity in shot size, until the shot size is below a threshold indicated by the dotted line 706. Below this threshold, the shot size linearity begins to decay causing the decay of the critical dimension measurement value. The graph 700 is therefore an indirect quantitative index of shot size linearity.

Referring back to FIG. 3, based on the e-beam shot size linearity determined, deficiencies therein may be compensated for, so that semiconductor patterns are subsequently produced properly by the e-beam system (308). For example, the e-beam dissection mode may be modified to avoid e-beam shot sizes that have poor linearity. An optimal shot size range may be defined, for controlling uniformity of the critical dimension(s). Suitable OPC results may be defined to avoid small feature sizes for which e-beam shots have deficient linearity. In this way, the error causes by e-beam shot size instability is determined and defined, such that shot size stability may be optimized.

Figure 8:
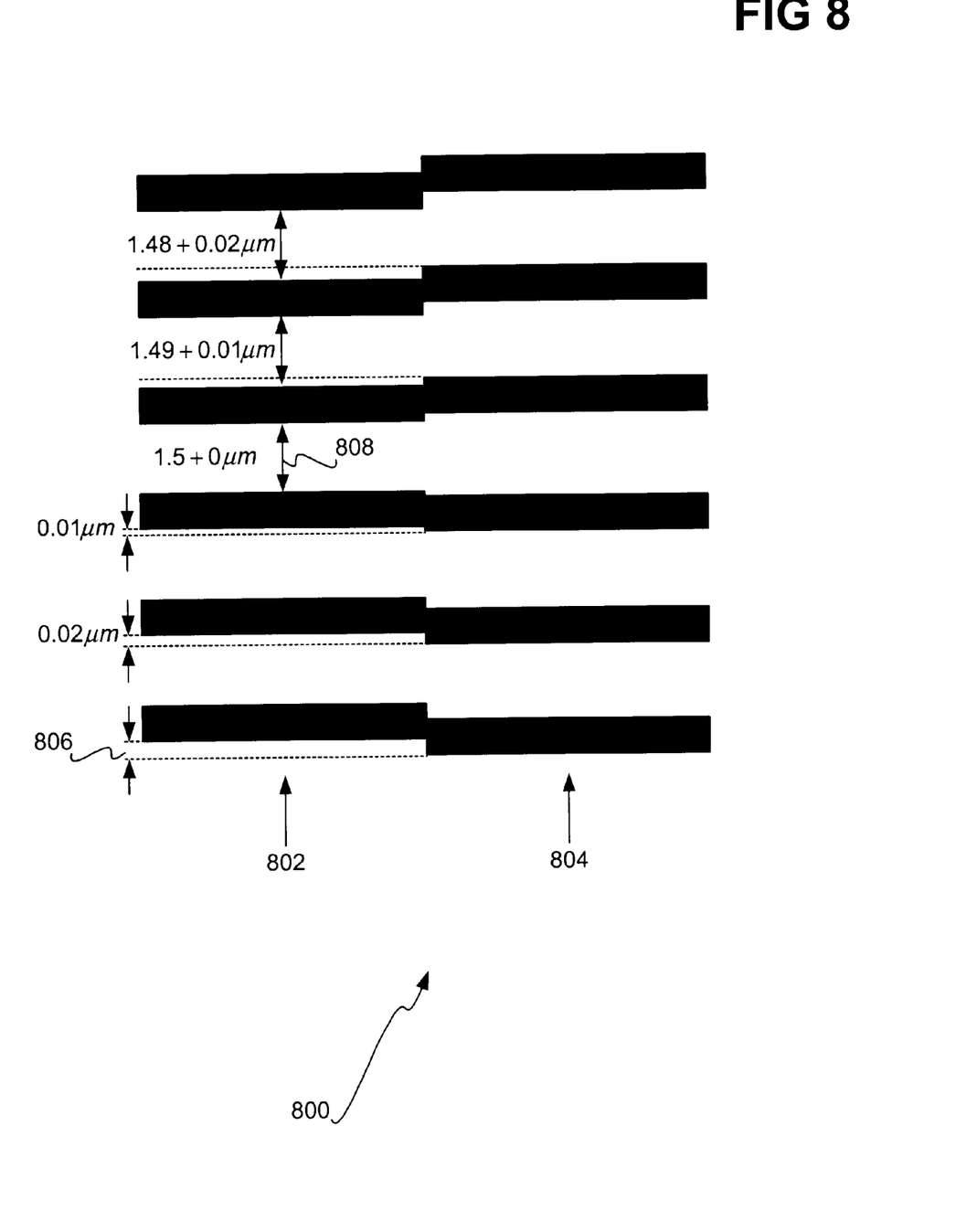
FIG. 8 is a diagram showing another pattern made up of the basic patterns of FIGS. 4A, 4B, 4C, and 4D, as used by an embodiment of the invention.

FIG. 8 shows a pattern 800 that can also be used as the pattern written in 304 of FIG. 3, according to another embodiment of the invention. The pattern 800 includes two columns 802 and 804 made up of the basic patterns of FIGS. 4A, 4B, 4C, and/or 4D, where the columns 802 and 804 are vertically offset from one another. For instance, the column 802 is offset from the column 804 by the amount 806, corresponding to a shot having a variable height between 0.01 and 0.7 microns throughout the column 802, as shown in FIG. 8. The pattern 800 allows the evaluation of the shot size linearity in 306 of FIG. 3 by measuring the critical dimensions 808 in FIG. 8, via directly measuring the exposed areas of the e-beam shots.

Figure 9:
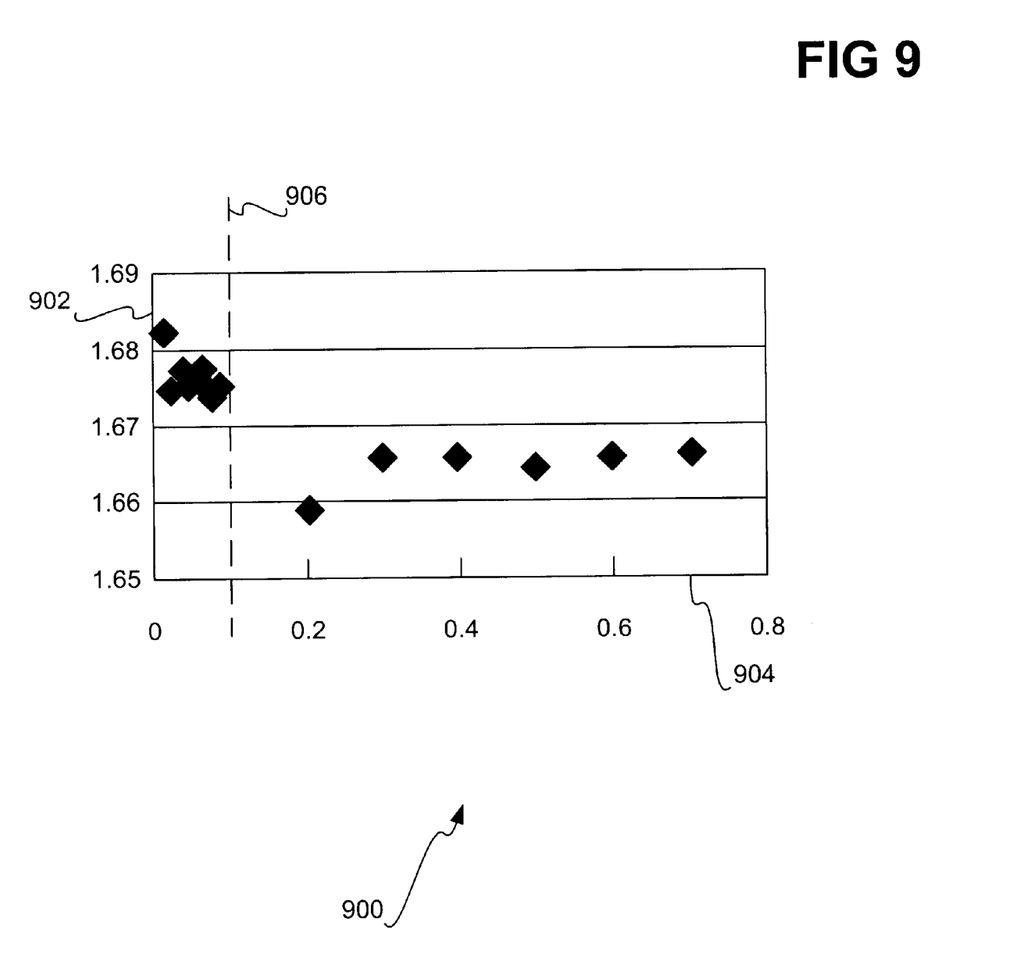
FIG. 9 is a diagram of another example graph showing when e-beam shot size linearity deficiency results for the pattern of FIG. 8, according to an embodiment of the invention.

FIG. 9 shows a graph 900 that plots the critical dimensions 808 on the y-axis 902 in microns as a function of shot size on the x-axis 904, based on the measurement of the critical dimensions 808 by directly measuring the exposed areas of the e-beam shots of FIG. 8. The critical dimension shows general linearity in shot size, until the shot size is below a threshold indicated by the dotted line 906. Below this threshold, the shot size linearity begins to decay. The graph 900 is therefore also a direct quantitative index of shot size linearity, such that deficiencies therein may subsequently be compensated for, as previously has been described in conjunction with 308 of FIG. 3.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method for monitoring electron beam (e-beam) shot size linearity in semiconductor lithography comprising:

writing a pattern having a predetermined size and a predetermined form in a predetermined position on a substrate to fix e-beam shot size located along one or more critical dimensions of the pattern; and, measuring the one or more critical dimensions at least indirectly, where variations in the one or more critical dimensions reflect the e-beam shot size linearity.

2. The method of claim 1, further initially comprising setting an e-beam dissection mode to a cflt setting.

3. The method of claim 2, further comprising modifying the e-beam dissection mode to avoid e-beam shot sizes having poor linearity.

4. The method of claim 1, further comprising compensating for deficiencies in the e-beam shot size linearity to allow for properly produced semiconductor patterns.

5. The method of claim 1, further comprising defining an optimal shot size range for controlling uniformity of the one or more critical dimensions.

6. The method of claim 1, wherein the pattern is made up of one or more of: one or more first basic patterns each of which is a critical dimension, one or more second basic patterns each of which is an e-beam shot having a fixed width and a variable height, one or more third basic patterns each of which is an e-beam shot having a fixed height and a variable width, and one or more fourth basic patterns each of which is an e-beam shot having a fixed size and shape.

7. The method of claim 6, wherein the pattern comprises the first basic pattern vertically oriented, and a series of row pairs intersecting orthogonal to the first basic pattern, each row pair including a first row having the fourth basic patterned followed by the second basic pattern horizontally oriented to one side of the first basic pattern and the second basic pattern followed by the fourth basic pattern horizontally oriented to another side of the first basic pattern, and a second row having the second basic pattern horizontally oriented to the one side of the first basic pattern and the second basic pattern horizontally oriented to the other side of the first basic pattern.

8. The method of claim 6, wherein the pattern comprises the first basic pattern vertically oriented, and a series of column pairs parallel to the first basic pattern and located on both one side and another side of the first basic pattern, each column pair including a first column having the fourth basic pattern followed by the third basic pattern followed by the fourth basic pattern vertically oriented, and a second column having the third basic pattern vertically oriented.

9. The method of claim 6, wherein the pattern comprises the first basic pattern vertically oriented, and a series of column pairs intersecting orthogonal to the first basic pattern, each column pair including a first column having the fourth basic pattern followed by the third basic pattern vertically oriented to one side of the first basic pattern and the third basic pattern followed by the fourth basic pattern vertically oriented to another side of the first basic pattern, and a second column having the third basic pattern vertically oriented to the one side of the first basic pattern and the third basic pattern vertically oriented to the other side of the first basic pattern.

10. The method of claim 6, wherein the pattern comprises the first basic pattern horizontally oriented, and a series of row pairs parallel to the first basic pattern and located on both one side and another side of the first basic pattern, each row pair including a first row having the fourth basic pattern followed by the second basic patterned followed by the fourth basic pattern horizontally oriented, and a second row having the second basic pattern horizontally oriented.

11. The method of claim 6, wherein the pattern comprises a proximity correction pattern made up of the first basic pattern vertically oriented, and a first column and a second column parallel to the first basic pattern, the first column located on one side of the first basic pattern and the second column located on another side of the first basic pattern, each of the first and the second columns having the fourth basic pattern followed by the third basic pattern followed by the fourth basic pattern vertically oriented.

12. The method of claim 6, wherein the pattern comprises a proximity correction pattern made up of the first basic pattern horizontally oriented, and a first row and a second row parallel to the first basic pattern, the first row located on one side of the first basic pattern and the second row located on another side of the first basic pattern, each of the first and the second rows having the fourth basic pattern followed by the second basic pattern followed by the fourth basic pattern horizontally oriented.

13. The method of claim 6, wherein the pattern includes a proximity correction pattern.

14. The method of claim 6, wherein the pattern includes a series of first rows vertically offset from a series of second rows, each first and second row including the first basic pattern horizontally oriented and vertically followed by the second basic pattern.

15. The method of claim 1, wherein measuring the one or more critical dimensions results in determining a relationship of the one or more critical dimensions to variation in e-beam shot size, from which the e-beam shot size linearity is determined.

16. The method of claim 1, wherein the substrate is one of: a semiconductor wafer, a photomask, and a reticle.

17. A computer-readable medium having instructions stored thereon for execution by a processor for an electron beam (e-beam) lithography system to perform a method comprising:

setting a dissection mode of the e-beam lithography system to a cflt setting;

writing a pattern having a predetermined size and a predetermined form in a predetermined position on a substrate to fix e-beam shot size located along one or more critical dimensions of the pattern; and, measuring the one or more critical dimensions at least indirectly, where variations in the one or more critical dimensions reflect the e-beam shot size linearity, where the pattern is made up of one or more of: one or more first basic patterns each of which is a critical dimension, one or more second basic patterns each of which is an e-beam shot having a fixed width and a variable height, one or more third basic patterns each of which is an e-beam shot having a fixed height and a variable width, and one or more fourth basic patterns each of which is an e-beam shot having a fixed size and shape.

18. The medium of claim 17, the method further comprising modifying the dissection mode to avoid e-beam shot sizes having poor linearity.

19. The medium of claim 17, the method further comprising compensating for deficiencies in e-beam shot size linearity to allow for properly produce semiconductor patterns.

20. A semiconductor device formed at least in part by electron beam (e-beam) lithography using an e-beam system, where the e-beam system has shot size linearity deficiencies corrected after evaluating the deficiencies by performing a method comprising:

writing a pattern having a predetermined size and a predetermined form in a predetermined position on a substrate to fix e-beam shot size located along one or more critical dimensions of the pattern; and, measuring the one or more critical dimensions at least indirectly, where variations in the one or more critical dimensions reflect the e-beam shot size linearity, where the pattern is made up of one or more of: one or more first basic patterns each of which is a critical dimension, one or more second basic patterns each of which is an e-beam shot having a fixed width and a variable height, one or more third basic patterns each of which is an e-beam shot having a fixed height and a variable width, and one or more fourth basic patterns each of which is an e-beam shot having a fixed size and shape.

* * * * *